United States Patent [19]
Bombay et al.

[11] Patent Number: 5,736,936
[45] Date of Patent: *Apr. 7, 1998

[54] METHOD AND APPARATUS FOR PREDICTING PEAK VOLTAGE OF A CABLE CONVEYED TOOL

[75] Inventors: Bart J. Bombay; Marvin W. Rasmussen; Lloyd D. Clark, Jr., all of Austin; Terry L. Mayhugh; Terry L. Mayhugh, Jr., both of Round Rock; Jimmy E. Neeley, Palacios; Guy Vachon, Austin, all of Tex.

[73] Assignee: Schlumberger Technology Corporation, Austin, Tex.

[*] Notice: The term of this patent shall not extend beyond the expiration date of Pat. No. 5,483,232.

[21] Appl. No.: 585,390

[22] Filed: Jan. 11, 1996

Related U.S. Application Data

[63] Continuation of Ser. No. 285,314, Aug. 3, 1994, Pat. No. 5,483,232.

[51] Int. Cl.$^6$ .................................................. G01V 1/00
[52] U.S. Cl. ........................... 340/853.1; 340/853.2; 324/543; 324/601; 324/691
[58] Field of Search ..................... 340/853.1, 853.2; 324/543, 601, 691

[56] References Cited

U.S. PATENT DOCUMENTS

| | | | |
|---|---|---|---|
| 5,150,064 | 9/1992 | Nozick | 324/691 |
| 5,309,294 | 5/1994 | Cahalan | 360/66 |
| 5,359,711 | 10/1994 | Hartmann et al. | 395/155 |
| 5,378,978 | 1/1995 | Gallo et al. | 323/241 |
| 5,465,029 | 11/1995 | Hanazaki et al. | 315/308 |
| 5,483,232 | 1/1996 | Clark, Jr. et al. | 340/853.1 |

*Primary Examiner*—J. Woodrow Eldred
*Attorney, Agent, or Firm*—Charles D. Huston; Danita J. M. Maseles

[57] ABSTRACT

A method and apparatus for predicting the peak voltage at the load end of a power transmission cable having a power supply end and a load end, where direct measurement at the load end is not practical. The method samples the current and voltage waveforms at the power supply end of the cable. The current waveform is used to estimate a current function which includes a full width at half maximum and adjustments for cable reactive current, distortions, and load. The product of the current function and a peak voltage sample from the power supply end is an estimate of the peak voltage at the load end. The method and apparatus have been applied to oil well logging where one or more logging tools are lowered at the end of a transmission cable into an oil well and it is desirable to predict peak voltage at the tools to ensure proper tool performance. An important improvement is a more accurate current function which compensates for capacitive current flow in the cable and includes a quadratic term. Additional improvements are described, namely a method for predicting downhole current, adjustments for power supply distortions, and diagnostic metrics.

18 Claims, 17 Drawing Sheets

5,736,936

METHOD AND APPARATUS FOR PREDICTING PEAK VOLTAGE OF A CABLE CONVEYED TOOL

This application is a continuation-in-part of application Ser. No. 285,314, U.S. Pat. No. 5,483,232 filed Aug. 3, 1994.

BACKGROUND OF THE INVENTION

1. Field of the Invention

This invention relates generally to a method for predicting the peak voltage of a tool or other load at the end of a power transmission cable. In particular, it relates to an improved method and apparatus for predicting the downhole peak voltage and current of a wireline tool or tool combination.

2. Description of Related Art

In wireline oil well logging, a number of tools are connected to a power and data transmission cable and lowered into the oil well borehole to obtain measurements of the geophysical properties of the area surrounding the borehole. Well-logging is the measurement of characteristics of different earth formations traversed by a borehole, usually an oil or gas well using one or more measuring instruments or tools. The tools are typically stacked in a tool string, the tool string being attached to a logging cable which supports the tool string, provides power to the tool or tools and provides a communication medium for the transmission of data from the tool or tools to data acquisition and processing equipment on the surface.

Downhole tools receive their power through the transmission cable. An AC power supply is connected on the surface to one end of the cable and the tools are connected to the other end of the cable for conveyance into and out of the borehole (see FIG. 1). FIG. 3 shows schematically how the tools are connected electrically to the uphole power supply. FIG. 4 shows in more detail that each tool rectifies the incoming AC voltage used by the tool to produce a tool DC voltage. For each tool to perform as designed, the tool needs to have its DC voltage $V_{dc}$ (as shown in FIG. 4) within a specified range. To obtain the specified range for $V_{dc}$ requires that the peak amplitude of the AC waveform downhole, $V_{acdh}$, (FIG. 4) must also be within a specified range. As shown in FIG. 4, $V_{acdh}$ in turn depends upon the uphole AC voltage $V_{acuh}$ and the losses on the cable. For the tools to operate properly it is important that the operator be able to set $V_{acdh}$ very accurately. Setting $V_{acdh}$ too low prevents the tool from working as designed. Setting $V_{acdh}$ too high can, in fact, damage the tool.

The difficulty with the waveforms in FIGS. 3 and 4 is that the current waveforms are distorted. The load is time varying and non-linear. The current is only drawn at the peaks of the AC power waveform when the input voltage exceeds the voltage level stored by the capacitor. During conduction, current flows across the high impedance power path causing clipping of the power voltage waveform seen by the tools. The impedance of the high impedance power path and the amount of power supply load and capacitance varies for different tools and cable types and cable lengths. $V_{dc}$ in FIG. 4 is proportional to the peak value of $V_{acdh}$. There is a real need to predict the value of the load's peak voltage waveform remotely from the power driving end in order to apply power without destroying the load.

Currently, oil field logging engineers go through a procedure in which they temporarily short out the end of the power path, apply some power and then zero out the uphole voltage meter to compensate for the cable impedance. This procedure is called power trim. Since this driving circuitry has no knowledge of the amount of clipping that will occur at the load end of the power path when an actual toolstring is connected, it does not compensate for this time varying load. It compensates as if the load were time invariant.

In other words, this is based on the assumption that $$V_{acdh}=V_{acuh}-(I_{wire} \cdot R_{wire})$$

The cable power trim measures $R_{wire}$. The circuitry that monitors power at the surface estimates the downhole voltage by first making an RMS measurement then subtracting from it ($I_{wire} \cdot R_{wire}$). This technique works if sinusoidal waveforms and time invariant loads are assumed. It yields worst case errors of about 30% when these assumptions fail.

The problem with this and other conventional metrics for quantifying sinusoidal voltages or currents are based upon moment calculations (i.e. average, RMS, or mean square). These moments are adequate if the shape of the waveform is well known and consistent (i.e. sinusoidal) because moment calculations are based on the area of the waveform. For these well-behaved waveforms the moment measured can be scaled to yield the measurement we actually want which is the peak value of the waveform. In the wireline logging application the waveforms are distorted, the shapes of the quantity being measured are basically unknown and so the moments cannot be calculated. Scaling a measurement based on these assumptions has proven to be only accurate to +/−30%.

U.S. Pat. No. 5,483,232 describes a system and method for solving these problems. Although U.S. Pat. No. 5,483,232 is a fair approximation to reality in many cases, remote cabling systems (as used in wireline logging) often have additional characteristics which must be addressed to achieve an accurate downhole tool head voltage prediction.

As the range of configurations of the remote (downhole) equipment increases, the approximation described in U.S. Pat. No. 5,483,232 sometimes has difficulty in accurately fitting the entire range of data. In order to accommodate a larger range of operations, the methods of U.S. Pat. No. 5,483,232 should be expanded to allow a much more accurate fit of the model to all operational situations.

The system of U.S. Pat. No. 5,483,232 assumed a purely resistive cable. Sometimes, however, a cable has substantial capacitance, and it may also have additional reactive load contributed by cable spooling (inductive), or reactive loads in the downhole tools themselves (inductive load of step-down transformers). See FIG. 10. The reactive load as seen from the surface causes distortion of the current waveform, and when these distortions are large, the previously described assumptions about the power waveforms become invalid. In order to more consistently apply the methods described in U.S. Pat. No. 5,483,232, the current waveform must therefore be corrected for reactive load.

In addition, an accurate estimate of downhole current is often useful for troubleshooting equipment. In some cases, cable capacitance can cause the surface current to be substantially more than the downhole current. In order to ensure safe operation of equipment, both downhole current and downhole voltage should be estimated accurately.

The correction of the current waveform for reactive load allows a modified implementation of the methods described in U.S. Pat. No. 5,483,232, but this correction does not address the effects on downhole tool head voltage by the reactive current flow. An additional correction to the head voltage algorithm is necessary to model the effects of reactive current flow.

Furthermore, U.S. Pat. No. 5,483,232 discussed a purely sinusoidal voltage source at surface. In practice, the surface voltage source is subject to a variety of distortions. As described in U.S. Pat. No. 5,483,232 some of this distortion may be removed by use of a low pass filter, yet other distortions remain which can seriously affect the downhole tool head voltage prediction. Therefore, it is one object of the present invention to provide an improved voltage prediction method which is robust to distortions of the surface voltage supply, and even include specific compensating factors for certain types of distortions.

In practice, distortions in the surface power voltage waveform are common. Due to the adverse effects of these distortions on cable communications, some measure of the severity of the distortion is desirable. While the analysis of the surface power waveforms is desirable for prediction of downhole tool head voltage, the waveforms may also be analyzed to give measures of several types of characteristic distortions. Although not limited to such use, these measures may prove useful in troubleshooting of system problems, such as wireline logging telemetry problems.

Wireline telemetry systems are susceptible to noise from the AC power supply. Power delivery and telemetry share the wireline cable. Even though they typically travel on different wires, capacitive coupling between the power path and telemetry cause cross talk. In an ideal situation this does not pose a problem; the idealized spectrum of a 60 Hz power signal relative to the telemetry pass band is as preferably distinct from the passband of the telemetry system.

With enough separation between the impulse at 60 Hz (representing the spectrum of an ideal 60 Hz sinusoidal power source) and the passband of the telemetry system, the 60 Hz component can be filtered out to recover the telemetry signal. In practice, however a number of factors contribute to "flat-topping" of the power signal. This "flat-topping" introduces high frequency components to the spectrum of the power signal.

When these high frequency components cross over the telemetry passband, the telemetry signal is distorted. This distortion adds to other sources of noise that affect the telemetry signal. Eventually, the amount of noise is sufficient to cause errors in the reception of the telemetry signal.

The objects of the present invention, therefore, include enhancements to the downhole tool head voltage prediction methods of U.S. Pat. No. 5,483,232; providing a downhole tool head current prediction method; and providing several metrics for analysis of the surface power waveform distortions for application to (but not limited to) wireline communications systems. The enhancements to the downhole tool head voltage prediction methods of U.S. Pat. No. 5,483,232 include:

1. a correction to the surface current waveform for reactive current flow,
2. a correction to the tool head voltage prediction to compensate for voltage drop on the cable due reactive current flow at the time of downhole peak resistive current flow,
3. a modification of the surface voltage reference which yields more robust response to distorted surface voltage,
4. and a further correction to the tool head voltage prediction to compensate for a specific type of surface voltage distortion. The power distortion metrics include measures of peak clipping and of high frequency waveform content.

SUMMARY OF THE INVENTION

The problems outlined above with current methods for predicting downhole tool peak voltage are largely solved by the method and apparatus of the present invention. The method hereof predicts the peak downhole voltage compensating for non-sinusoidal waveforms and time variant loads. The method approximates the width of the uphole current pulse, measures a peak uphole voltage, and determines a corresponding peak downhole voltage. By determining peak downhole voltage, the operator is able to adjust the power supply to obtain optimum tool and tool combination performance without damage to any of the tools. While the method and apparatus of the present invention is particularly applied to wireline logging, it is equally applicable to other applications where it is important to control or predict the power or voltage characteristics of a load at the end of a transmission cable remote from a power supply.

Generally speaking, the method of the present invention for predicting peak voltage contemplates a transmission cable coupled to an AC power supply where it is desirable to predict the peak voltage at the remote end. The method samples the current and voltage of the AC waveform at the power supply end of the cable to obtain a plurality of current and voltage samples defining respective current and voltage waveforms. A pulse width function of the power supply current waveform is approximated. The remote end peak voltage is predicted by multiplying the current pulse width function by a power supply peak voltage sample. In an improved form, the pulse width function includes an adjustment to compensate for the capacitive current effect on the cable.

In a wireline oil well logging system application the apparatus of the present invention predicts peak downhole voltage based on the current and voltage uphole waveforms. The apparatus samples the uphole voltage and the uphole current, and also includes a processor which utilizes the current and voltage samples. The processor determines a current pulse width function based on the uphole current samples, determines an uphole voltage value from the uphole voltage samples, and predicts the peak downhole voltage as the product of the uphole voltage and the current pulse width function.

The present invention also includes several improvements which are believed to be particularly useful. First, the present invention provides a method for downhole tools voltage and current prediction which can be useful in both diagnostics and operation of the downhole tools. Second, the present invention includes the provision of several measures of surface power waveform distortions, which is useful in many applications but particularly in wireline logging applications where the logging cable includes both power and a telemetry channel. Finally, the method of predicting downhole tool head peak voltage includes a correction compensating for certain types of surface and voltage distortions.

DESCRIPTION OF THE PREFERRED EMBODIMENTS

Figure 1:
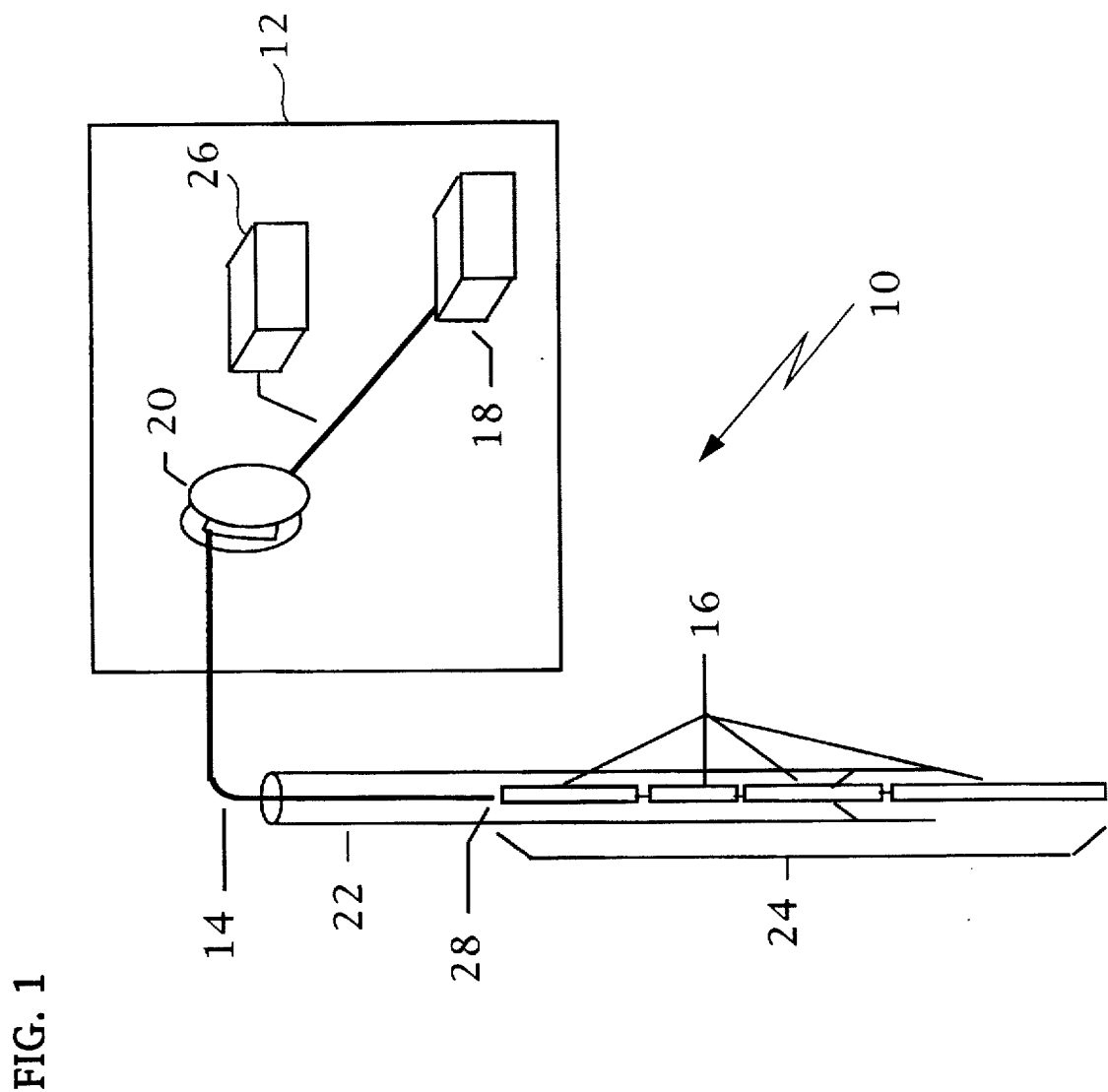
FIG. 1 is a schematic showing the apparatus of the current invention in the context of an oilwell logging system.

Turning now to the drawings, FIG. 1 shows a schematic of an oil well logging system 10 which includes an acquisition system 12, cable 14, and one or more tools 16. The acquisition system 12 includes an AC tool power supply 18 which supplies AC power over the cable 14 to the tool 16. The cable 14 circumvolutes a reel 20 before entering a borehole 22. Typically, the tools 16 are preassembled before lowering in the borehole 22 into a combination or tool string 24. The prediction apparatus 26 of the present invention is preferably coupled to the cable 14 preferably between the AC power supply 18 and reel 20. The prediction apparatus 26 samples voltage and current passed over the cable 14 from the power supply 18. Of importance to the present invention is determining the voltage at the head 28 of the tool string 24.

Figure 2:
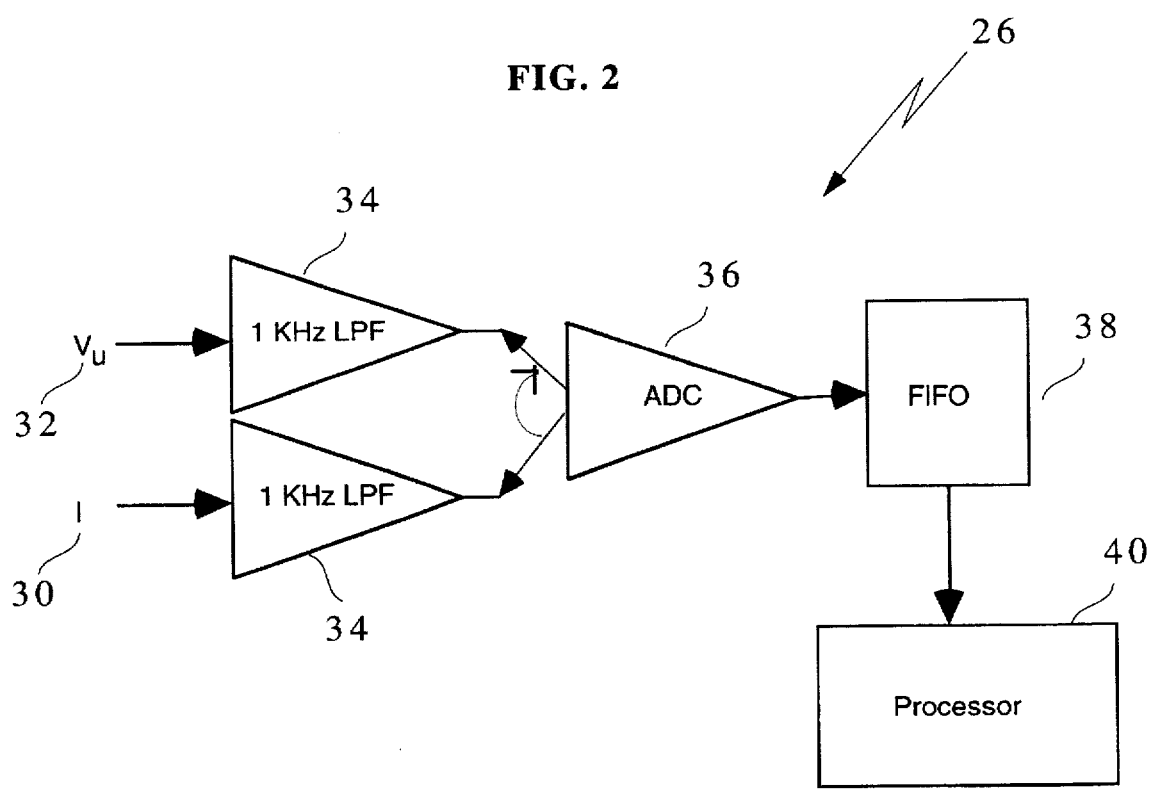
FIG. 2 is a schematic showing the apparatus of the preferred embodiment in more detail.
Figure 3:
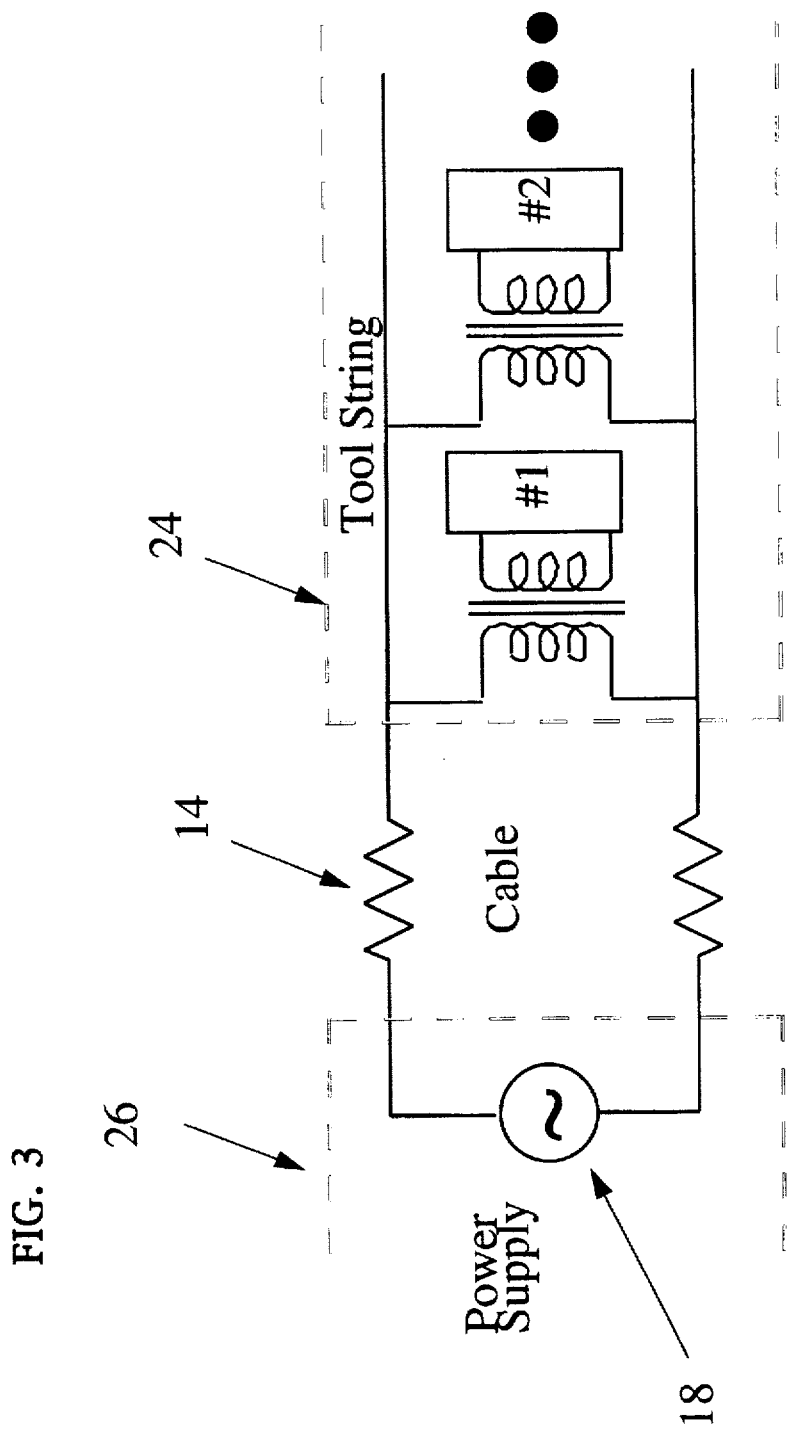
FIG. 3 is an electrical schematic illustrating the tool relationship to the power supply and cable resistance.

Turning to FIG. 2, the prediction apparatus 26 is illustrated in more detail. As can be seen from FIG. 2, the prediction apparatus 26 includes an analog front-end that samples the current and voltage as at 30, 32. To eliminate the effects of various random high frequency noise sources, a pair of 1 KHz low-pass filters 34 are used to receive the current and voltage samples 30, 32. Preferably the low-pass filters 34 eliminate the noise without eliminating important spectral content of the current and voltage samples. The current and voltage samples 30, 32 are then passed then to an A to D converter with the digital values fed to a FIFO buffer 38. A processor 40 reads the buffer to perform the computations required to estimate the downhole voltage.

The sampling rate at 30, 32 affects the accuracy of measurements and therefore a high sampling rate is desirable. The preferred embodiment uses a 6 KHz sample rate for 60 Hz waveforms, resulting in an ultimate quantization error of approximately (+/−) 5%. The resolution of the A to D converter 36 also affects the accuracy, but 8-bit appears to be sufficient to make the A/D converter quantization error negligible with respect to the quantization error introduced by the sampling rate. The processor 40 operates often enough to give the effect that the downhole voltage is continuously predicted. In the embodiment of FIG. 2, the update rate is approximately 10 Hz.

Figure 4:
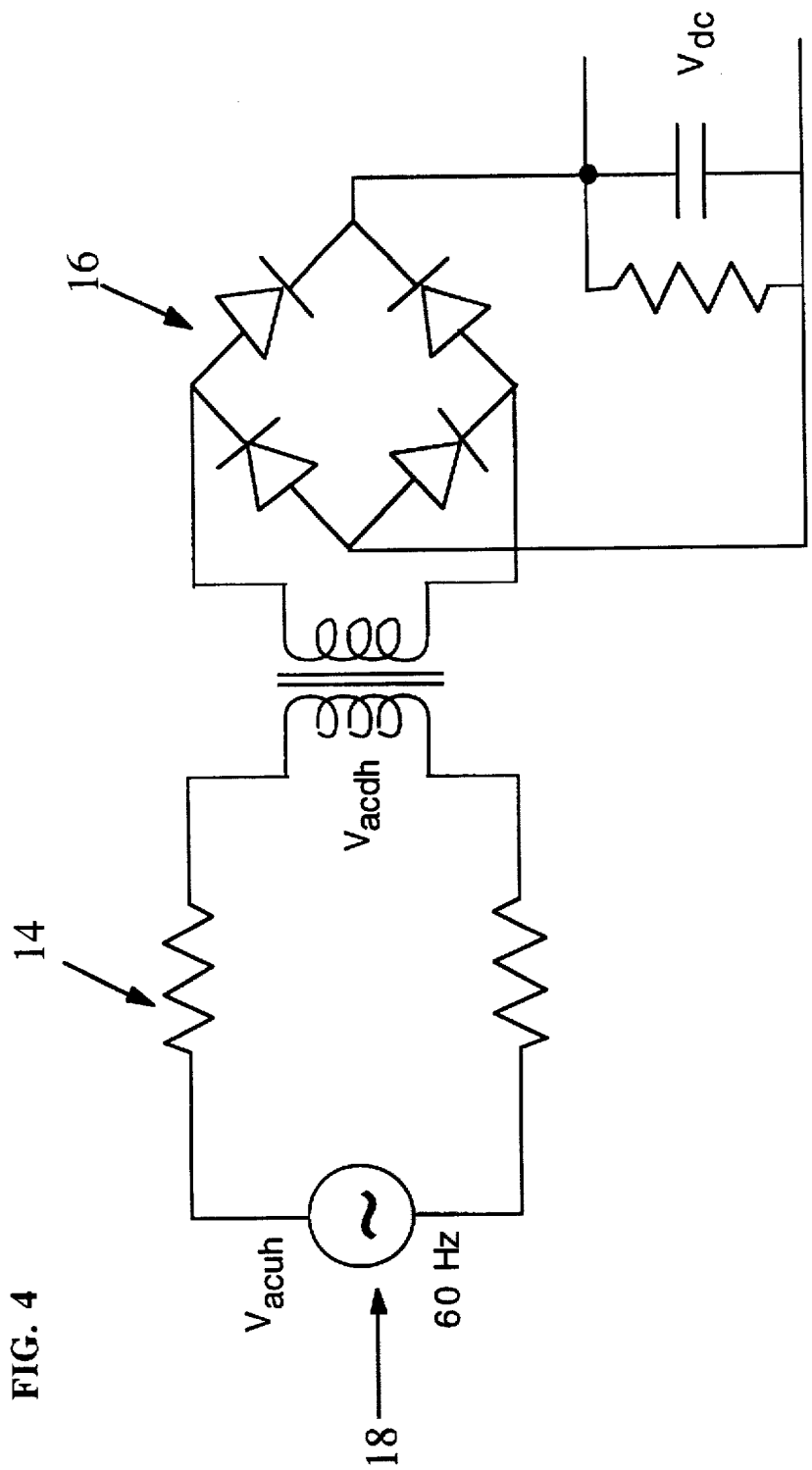
FIG. 4 is an electrical schematic similar to FIG. 3 illustrating tool full wave rectifications to generate the desired downhole $V_{dc}$ voltage.

As previously indicated, for the tools 16 to operate properly, the DC voltage ($V_{dc}$) must lie within a specified range (see FIG. 4). As shown in FIG. 4, the downhole DC voltage ($V_{dc}$) is dependent upon the downhole AC voltage ($V_{acdh}$) which in turn is dependent upon uphole voltage ($V_{acuh}$) at the power supply 18. As can be appreciated from FIG. 4, losses on the cable 14 are also a factor on controlling the $V_{dc}$, and these losses are of course dependent upon cable length and type.

If some simplifying assumptions are made, it is possible to derive a functional relationship between uphole voltage, downhole voltage, and the duration of uphole current pulses. Turning to FIG. 4, assume that the downhole voltage on the right side of the rectifying bridge is a perfect dc voltage with no ripple, labeled $V_{dc}$. If this is true and the bridge is ideal, then uphole current will flow only when the instantaneous value of the uphole voltage is greater than $V_{dc}$. If we attribute all differences between the uphole and the downhole voltage to IR drop on the cable 14, there will be no drop until the bridge begins to conduct so the voltage downhole will be the same as the voltage uphole until that point. Such a waveform is illustrated in FIG. 5 where the uphole current waveform is labeled 50, the uphole voltage waveform is labeled 52, and the downhole voltage waveform is labeled 54.

Figure 5:
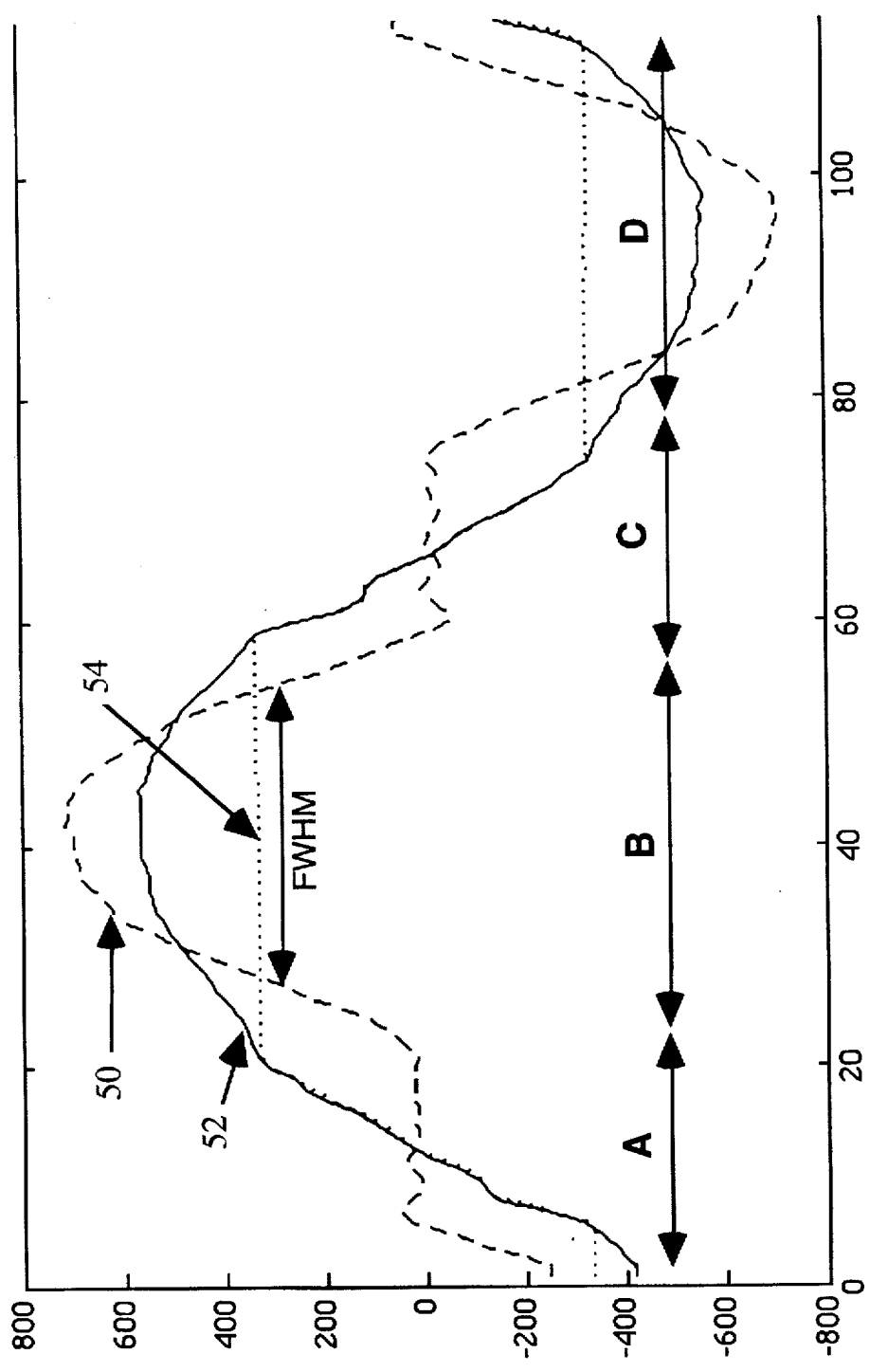
FIG. 5 is a graph showing uphole current waveforms and uphole voltage waveforms plotting amplitude versus time.
Figure 6:
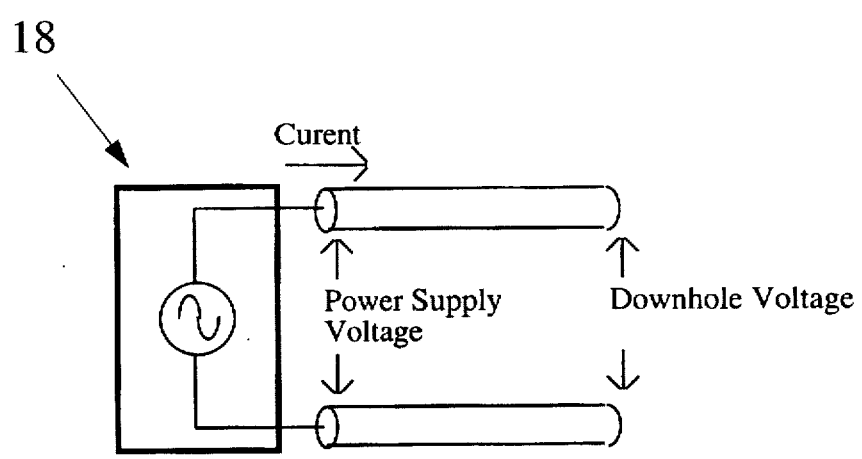
FIG. 6 is an electrical schematic illustrating circuit equivalents before and after conduction.
Figure 7:
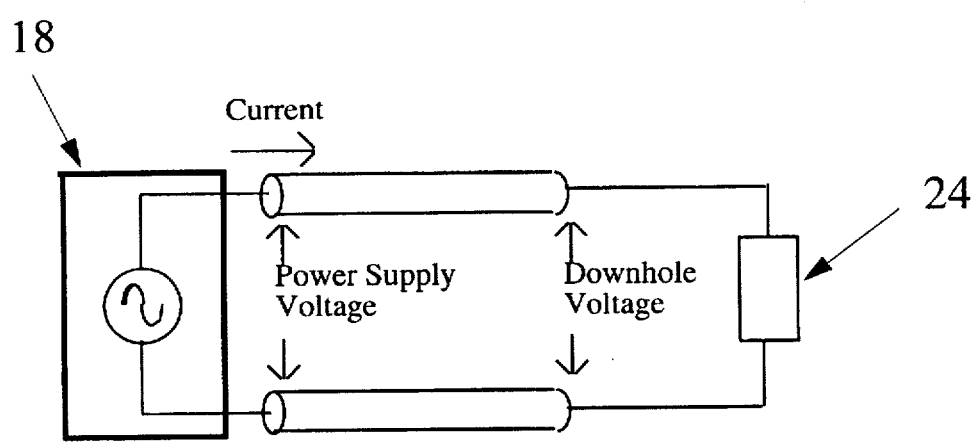
FIG. 7 is a circuit diagram depicting the effective circuit during conduction.

Because the circuit illustrated in FIG. 4 is actually time varying, during the time given by regions A and C of FIG. 5, the circuit appears as depicted in FIG. 6. During the time given by regions B and D of FIG. 5, the circuit appears as illustrated in FIG. 7.

As an explanatory example, assume that there is no drop across the cable 14 until current begins to flow so until then $V_{uphole}=V_{downhole}$ but after current flows, $V_{downhole}$ remains flat as shown in FIG. 5. If $V_{uphole}$ is measured at the time current begins to flow and it is assumed to be equal to $V_{downhole\ peak}$, a good estimate of the downhole peak voltage can be made. Transmission line effects on the cable 14 and various second order rectifier and load effects make it difficult to tell precisely when current begins to flow, and asymmetries in the waveforms render this impractical, but it illustrates one way to relate $V_{uphole}$ and the time when current flows to $V_{downhole-peak}$.

As another explanatory example, assume a cosine form for the uphole voltage waveform, and $V_{dc}$ is constant. The times at which the uphole current will turn on or off will be times t such that $$V_d = V_u \cdot \cos(2\pi f t) \qquad \text{Equation 1}$$

where $V_u$ is the peak uphole voltage and f is the frequency. If Equation 1 is rearranged to solve for the duration of an uphole current pulse t, the following equation is obtained:

$$t = \frac{1}{\pi f} \cdot \arccos\left(\frac{V_d}{V_u}\right) \qquad \text{Equation 2}$$

Equation 2 implies that the duration of an uphole current pulse t is a direct function of the ratio of the uphole voltage and downhole voltage. It also implies that, knowing only the duration of an uphole current pulse (or something related to it, such as its Full Width at Half Maximum—FWHM, see FIG. 5) and the uphole voltage, it should be possible to solve this equation for the downhole voltage if the given assumptions are valid.

In reality, it is not possible to accurately compute the relation between t and $a/V_u$ using equations 1 and 2. The power waveform is distorted to where it is not a sinusoid. The resulting current waveform is dominated by higher frequency components. It is also asymmetrical. Instead, the preferred embodiment of U.S. Pat. No. 5,483,232 uses a linear approximation to the function of Equation 2 which yields results far better than the prior art.

The general approximation is:

$$\frac{V_d}{V_u} = (m \cdot FWHM + y) \text{ or } V_d = V_u \cdot (m \cdot FWHM + y) \qquad \text{Equation 3}$$

Figure 8:
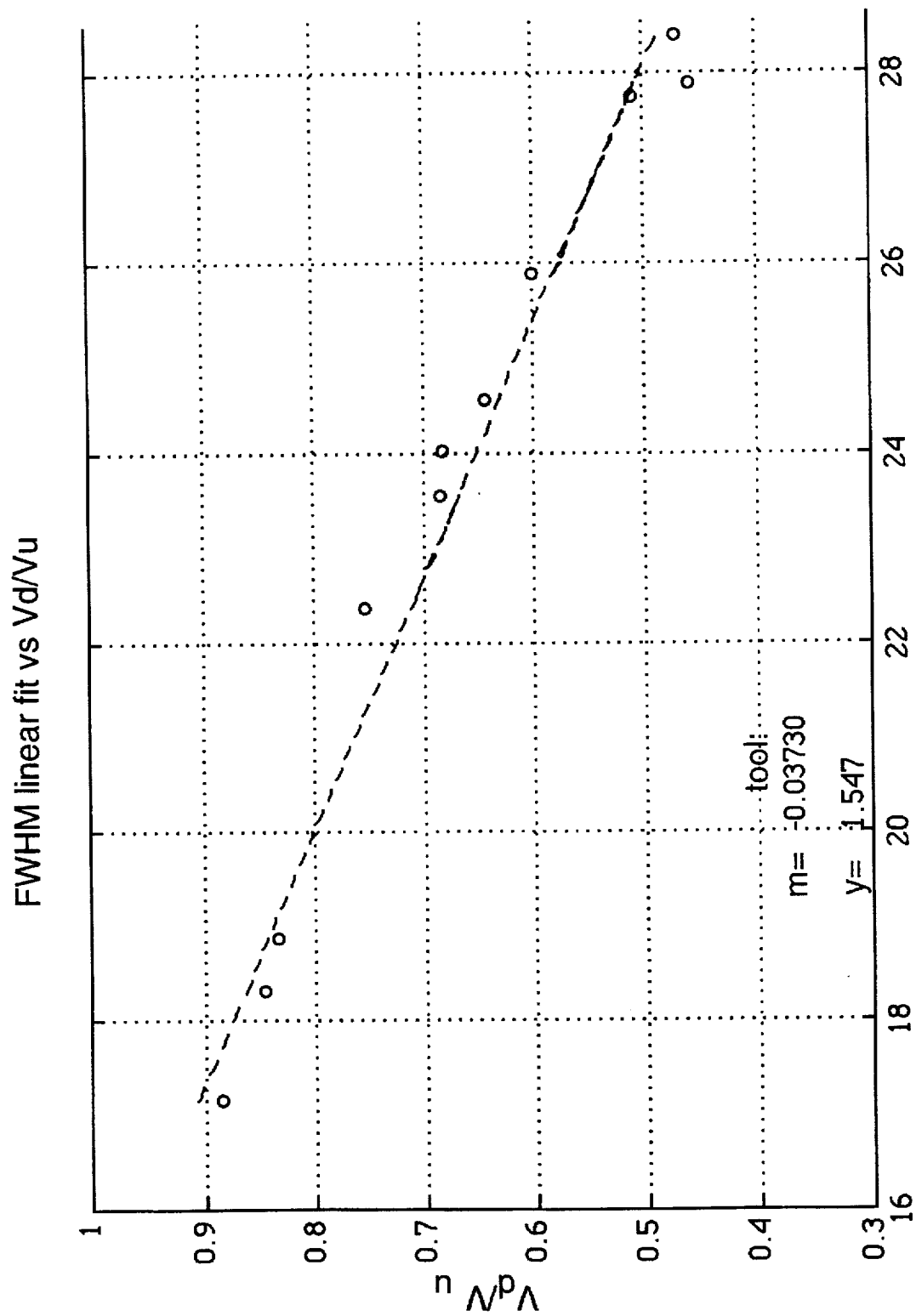
FIG. 8 is a graph plotting the use of $V_d/V_u$ against full width at half maximum (FWHM) measurements.

In order to compute m & y, measurements were made to determine the uphole voltage, downhole voltage, and current for a variety of tool combinations, cable types and cable lengths. A linear regression was used to compute m and y for the line that best fit the data points; the results are illustrated in FIG. 8.

Figure 9:
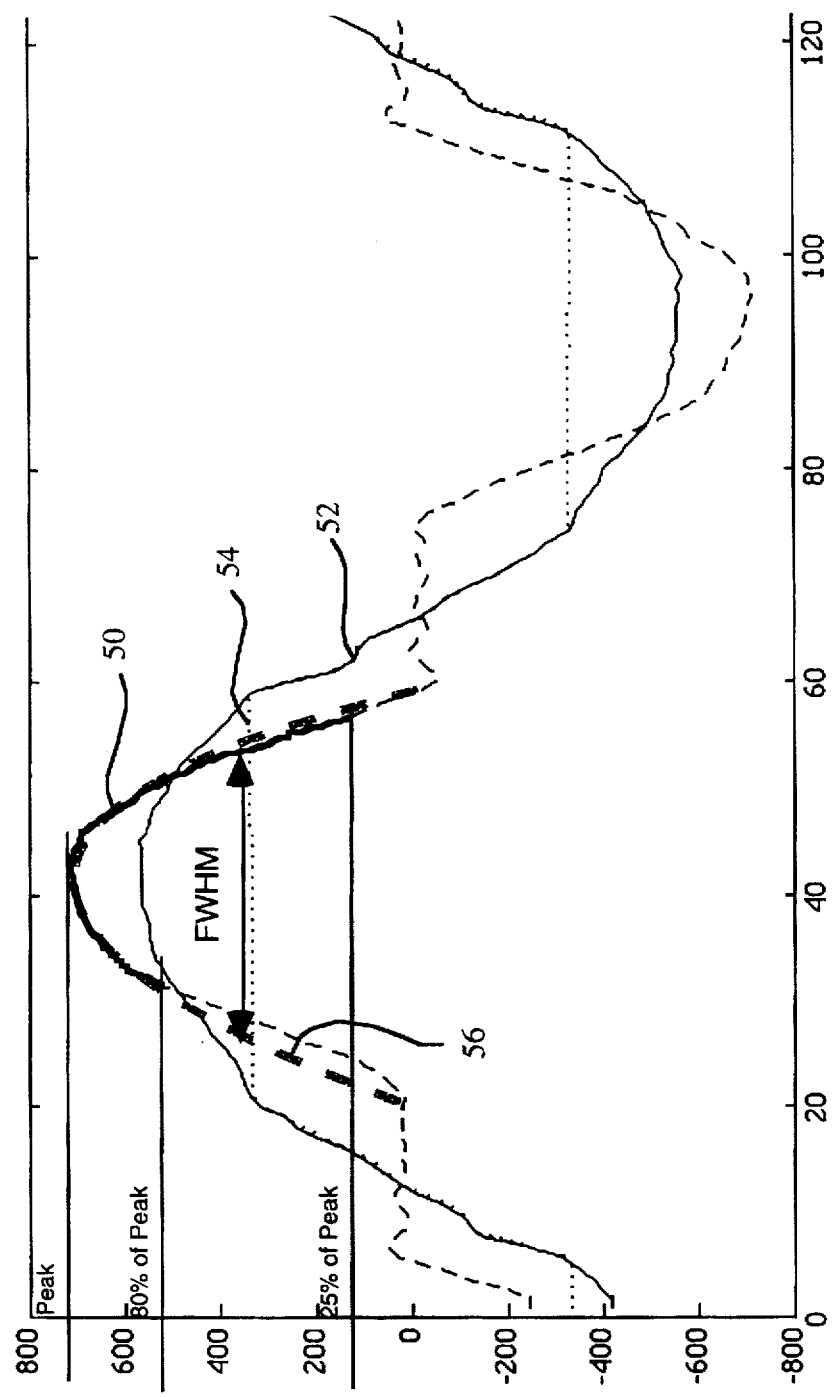
FIG. 9 is a graph similar to FIG. 5 illustrating clipping regions of the leading and trailing edge current uphole waveform to approximate the full width at half maximum (FWHM)
Figure 10:
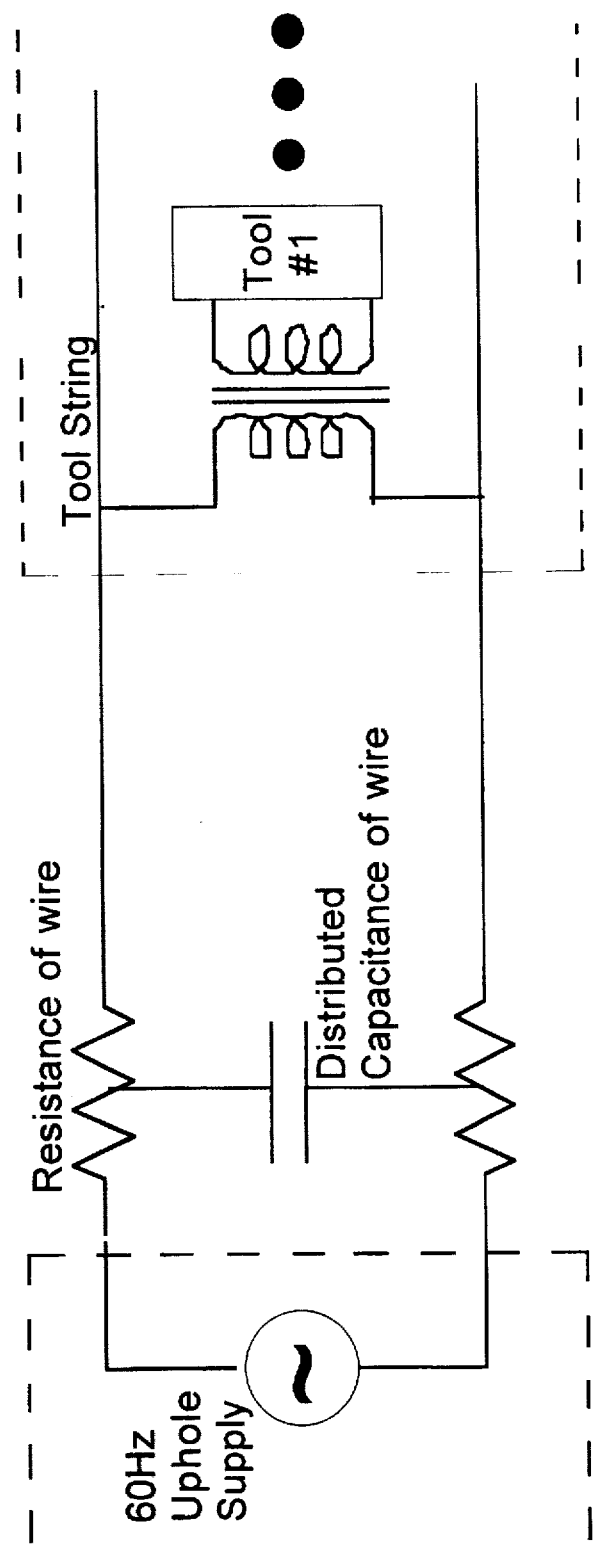
FIG. 10 is an electrical schematic similar to FIG. 4 depicting the cable capacitance and resistance.

Accurate computation of the FWHM is difficult as one can see from FIG. 5 because the current waveform 50 is noisy and asymmetrical. The majority of the asymmetries affect the leading edge of each current pulse. FIG. 9 illustrates the approach of the preferred embodiment of U.S. Pat. No. 5,483,232 to increase accuracy of the FWHM estimate. In order to eliminate the effect of the asymmetries in the FWHM measurement, the points on the current waveform 50 that lie between the 80% point and the 25% point are fitted with a second order polynomial with a linear regression as illustrated by curve 56. The equation of the resulting curve 56 is solved for the FWHM. An alternative embodiment which is less computationally intensive though potentially less accurate is to estimate FWHM by measuring the time interval from 65% of max before current peak to 65% of wax after peak.

Although successful for many system configurations, the curve fitting process (FIG. 9) is too simple to provide accurate results for the wide range of equipment used in wireline logging operations: the linear approximation does not sufficiently model the entire range of load configurations; the algorithm does not address the effects of reactive current flow; and the algorithm does not have sufficient robustness against a distorted power supply at surface.

Improvement

Turning again to FIGS. 1 and 2, the improvement of the present invention includes the illustrated analog front end that samples the current and voltage as at 30, 32 and feeds it to the analog to digital converter 36. The digital values from A to D converter 36 are fed to a FIFO 38 readable by the processor 40 that performs the computations used to estimate the downhole voltage.

The sampling rate as at 30, 32 affects the absolute accuracy of the measurement and so a high sampling rate is desirable. At the 6 KHz rate used in the preferred embodiment for 60 Hz waveforms, the quantization error is approximately (+/−) 5%. The ADC 36 resolution also affects the accuracy, but 8-bit length appears to be sufficient to make the ADC quantization error negligible with respect to the finite sampling rate quantization error. An alternative implementation has been achieved with a 8333 Hz sampling rate and a 16 bit ADC.

Figure 11:
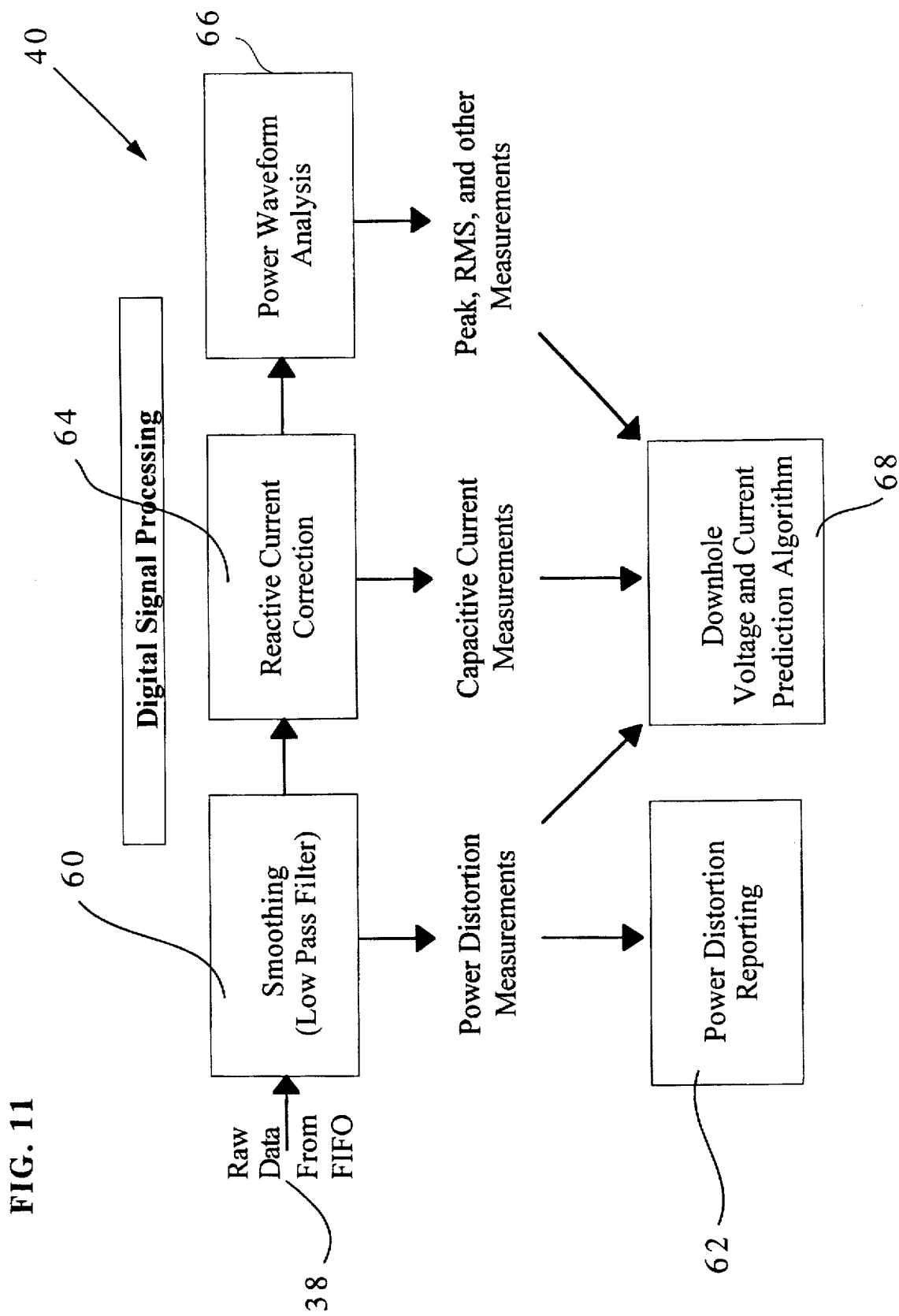
FIG. 11 is a block diagram illustrating the processing functions of the processor in FIG. 2.

In broad form, the digital signal processing of the method of the improvement are illustrated in FIG. 11. As can be seen from FIG. 11, first, the digital data from FIFO 38 pass through a filtering or smoothing step 60 to eliminate the effects of various random high frequency noise sources. A 1 KHz low pass filter appears adequate to eliminate these noise sources without eliminating important spectral content used by the method. Alternatively, the method has also been shown to be effective with low pass filters at 60 having a cut off as low as 400 Hz.

This smoothed digital data 60 is used in two processes: power distortion measurement and reporting as at 62 and reactive current correction as at 64. As can be seen from FIG. 11, the digital data corrected for reactive current at 64 is used in a power waveform analysis at 66, and is also used for predicting downhole voltage and current as at 68.

Reactive Current Correction

Figure 12:
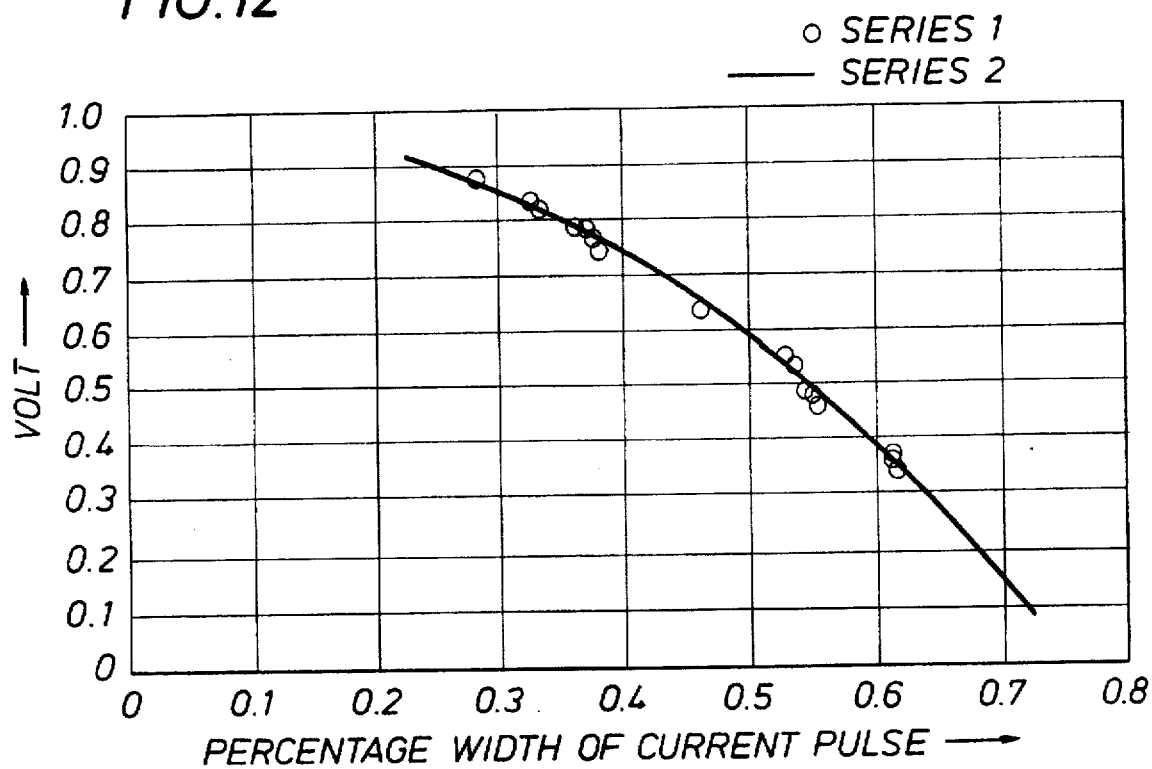
FIG. 12 is a graph illustrating the favorable results obtained from introducing a quadratic term into the pulse width function.

The empirical linear model used by the method of U.S. Pat. No. 5,483,232 does not accurately fit the entire range of configurations of downhole equipment used in wireline logging operations. The introduction of a quadratic term into the previous empirical model (see Equation 3) allows a much more accurate fit when the range of operations is large and the experimental data is statistically sufficient to support the additional term, yielding the following generalized equation, $$\frac{V_d}{V_u} = (m_1 \cdot FWHM + m_2 \cdot FWHM^2 + y), \qquad \text{Equation 4}$$

where FWHM is the Full Width Half Maximum of a current waveform pulse. This current pulse width need not be measured specifically at half maximum current level; in practice, the measurement is made at a level which is a constant percentage of the current maximum. This constant percentage is chosen so that the width is stable (usually at higher levels) and also so that it provides a good indicator of the actual conduction time during the pulse (usually at lower levels). Therefore, the term FWHM should be understood in this application as an estimate of the width of the current waveform, but not necessarily at half maximum amplitude. Experiments have verified the validity of the second order term, as shown in FIG. 12.

Additionally, the method of U.S. Pat. No. 5,483,232 assumed that the surface system did not see any reactive load. In practice, the system will see reactive loads from cable capacitance and other factors; this reactive current can distort or even overwhelm the apparent current draw from the tool power supplies.

Figure 13:
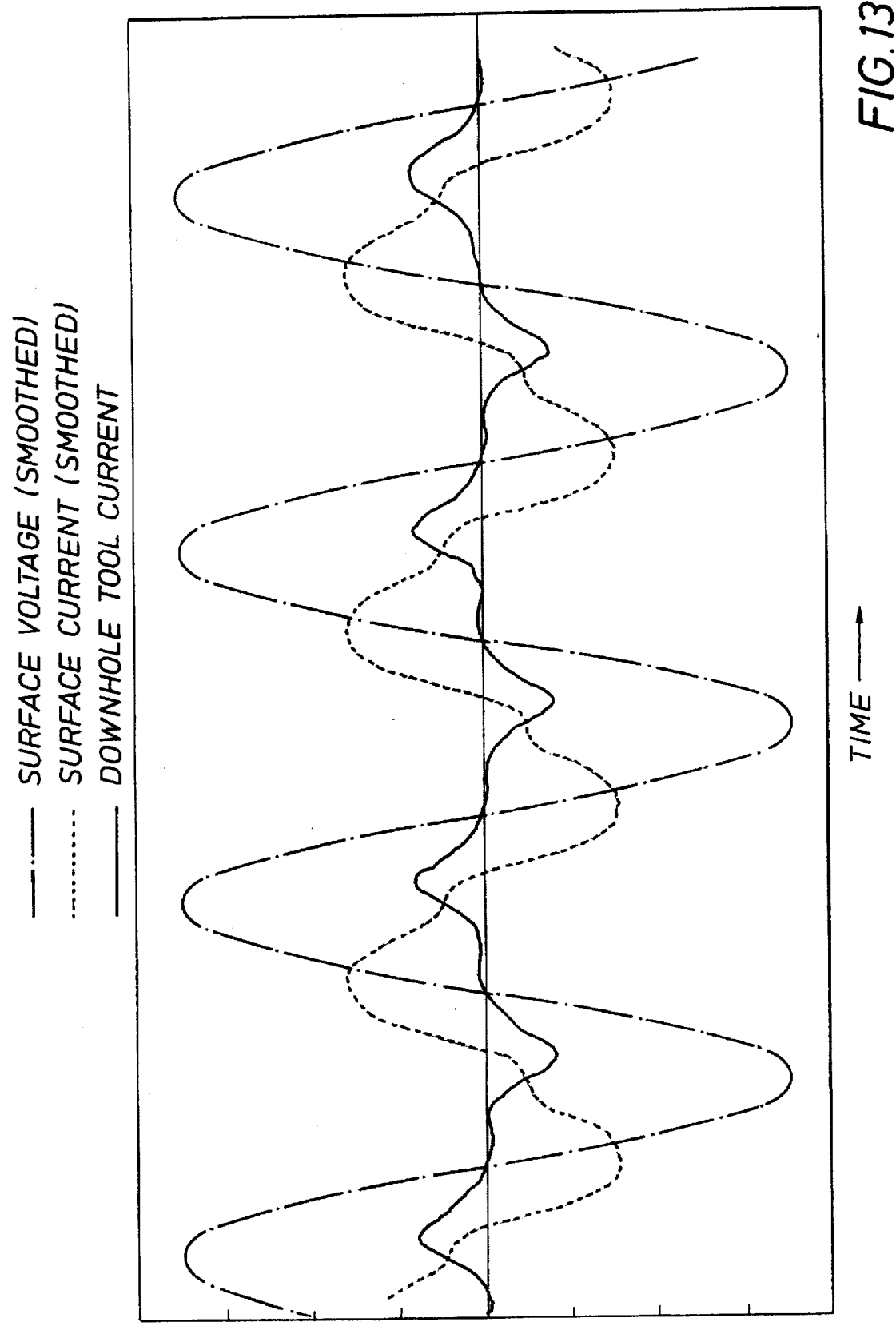
FIG. 13 is a graph depicting current and voltage waveforms, and illustrates the large difference in magnitude between surface current and downhole current.
Figure 14:
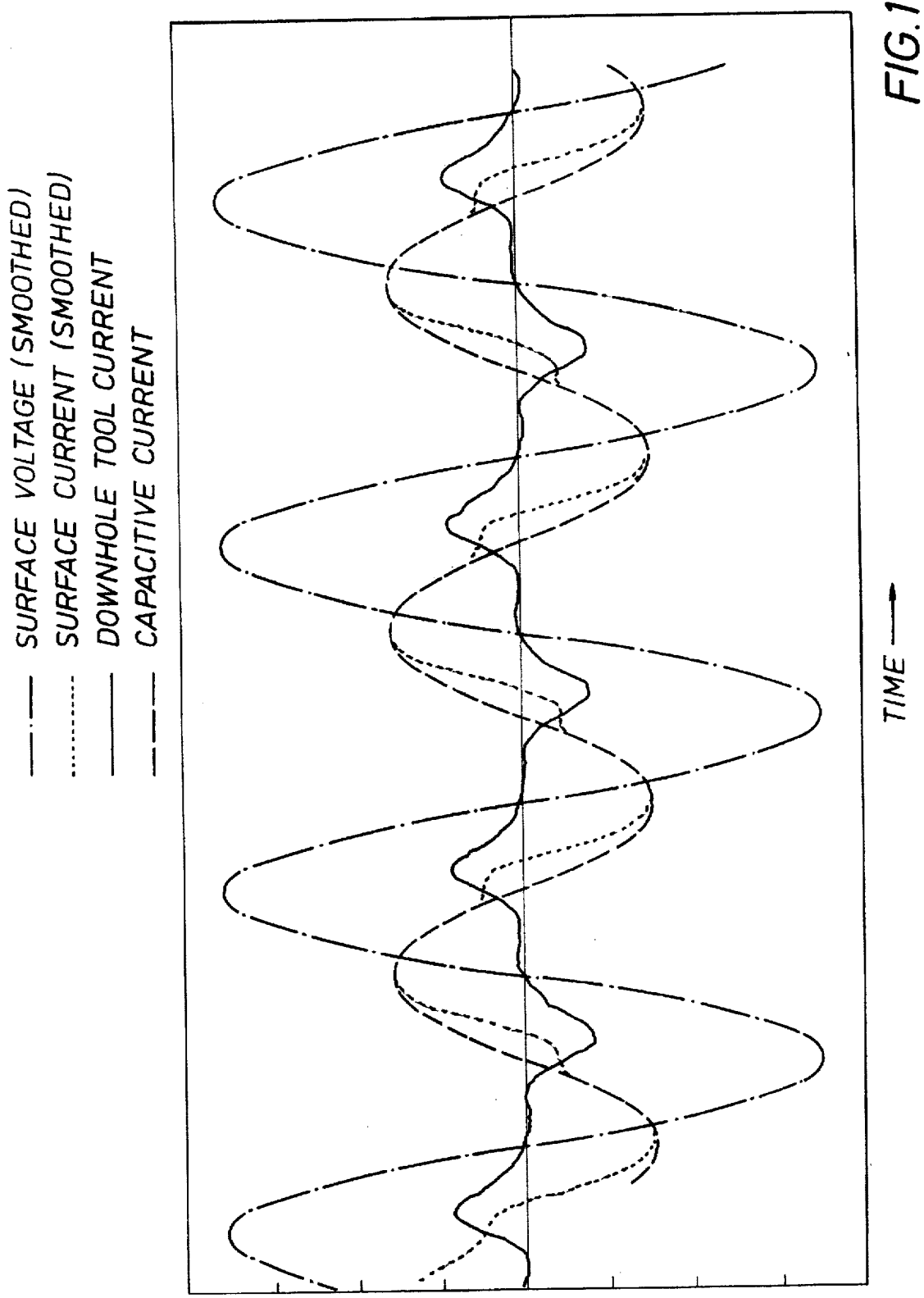
FIG. 14 is a graph similar to FIG. 13, with the addition of a capacitive current waveform.

FIG. 13 shows a total surface current which is much larger in magnitude than the current being drawn by a downhole tool 24. When the tool current is added to the reactive current being drawn by the capacitance of the cable 14 (FIG. 1), the result is the current waveform as seen at surface. The total reactive current and tool current add to yield the surface current as shown in FIG. 14. Because reactive current is believed to comprise primarily the current being drawn by the capacitance of the cable, in this application "reactive" and "capacitive" current are sometimes used interchangeably.

By making a simplifying assumption that all reactive loads are located at the top of the cable 14, the current measured at surface voltage zero crossing implies the total reactive load. This current measured at the voltage zero crossing can be extrapolated over a sinusoidal waveform to yield an estimated capacitive current waveform. When subtracted from the total surface current waveform, the estimated downhole tool current waveform results. The previously described method (see Equation 4) can be applied to this estimated downhole tool current waveform to yield an estimated downhole voltage. Experimental results show this enhanced method to be much more accurate than the method of Equation 4 used by itself.

This improved downhole current prediction method uses the reactive current corrected waveform (as above), and performs a root mean square function on the waveform to obtain the downhole current magnitude:

$$I_d = \left( \frac{1}{T} \cdot \sqrt{\sum_{i=0}^{T} (I_{cap_i} - I_{ui})^2} \right),$$

Equation 5 where T is the waveform period, $I_d$ is the downhole current estimate, $I_{cap_i}$ is the $i^{th}$ sample of the estimated capacitive current sinusoid, and $I_{ui}$ is the $i^{th}$ sample of the surface current waveform.

Figure 15:
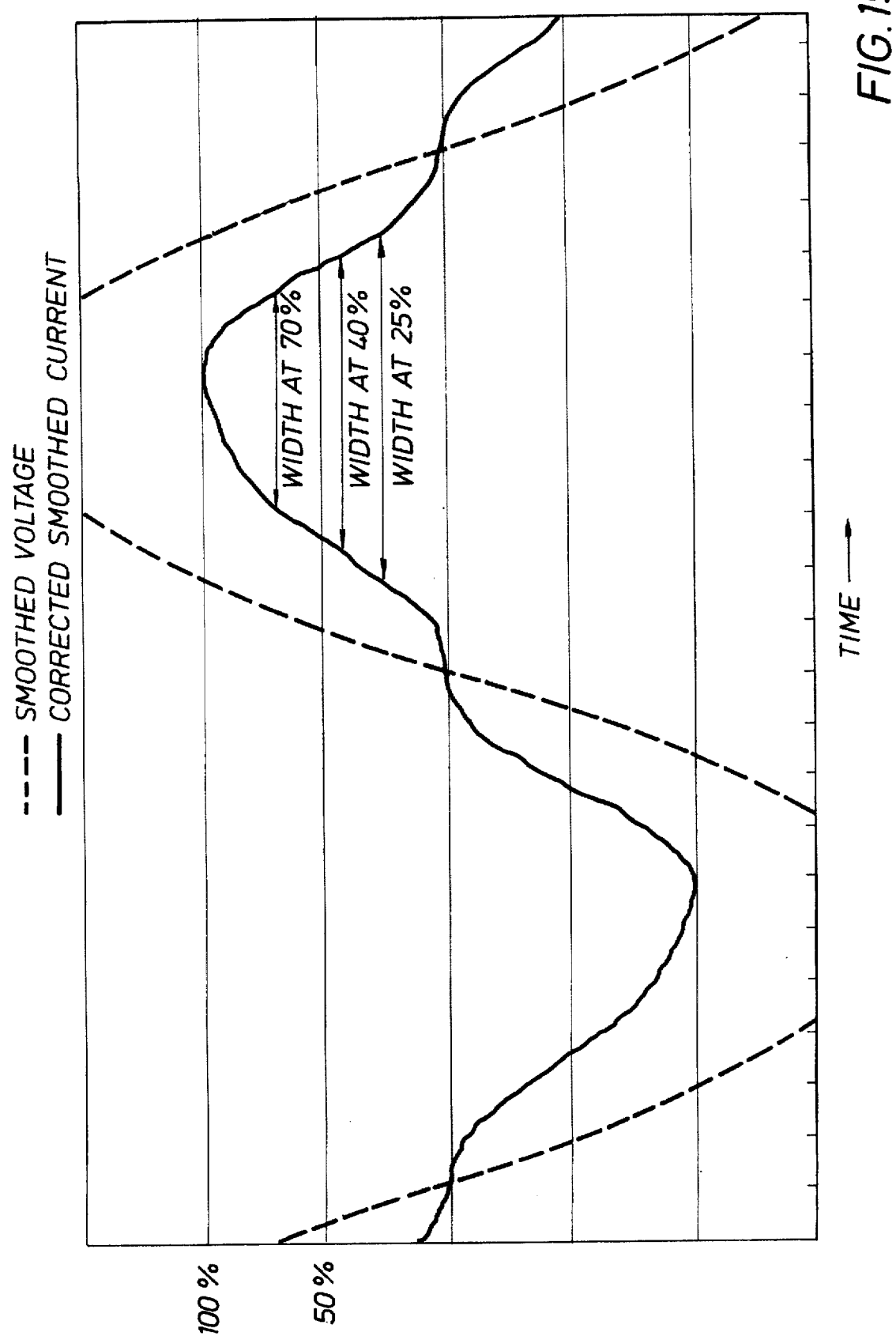
FIG. 15 is a graph of smoothed voltage and current waveforms.

The correction for capacitive current also eliminates most of the current waveform asymmetries which had limited the accuracy of the method of U.S. Pat. No. 5,483,232 and required clipping techniques to yield a better approximation. When combined with a smoothing algorithm, the resulting waveform is much more stable. In theory, the downhole voltage is closely related to the time of the beginning and end of conduction. The current pulse width measurement is therefore more ideally taken at a lower current level, as long as the measurement remains stable at the lower level. The stability gained by smoothing allows the current pulse width measurement to be taken at a much lower current level (the previous measurement was taken at the 70% level, see FIG. 15). Experimental data has verified increased accuracy using a 40% level, as illustrated in FIG. 15.

In reality, the reactive load of the system is distributed over the entire cable 14 and toolstring 24. Most commonly, the cable 14 has an evenly distributed capacitance, and the toolstring 24 has a nonlinear inductance.

Because the reactive current must flow at least part way down the resistive cable, this current flow has an effect on the downhole voltage waveform. Fortunately, the reactive current draw is 90 degrees out of phase with the voltage, so that this flow is near minimum when the downhole voltage peak occurs, and the effects of the flow on downhole voltage are relatively small. Nevertheless, those effects can be significant in some cases.

Figure 16:
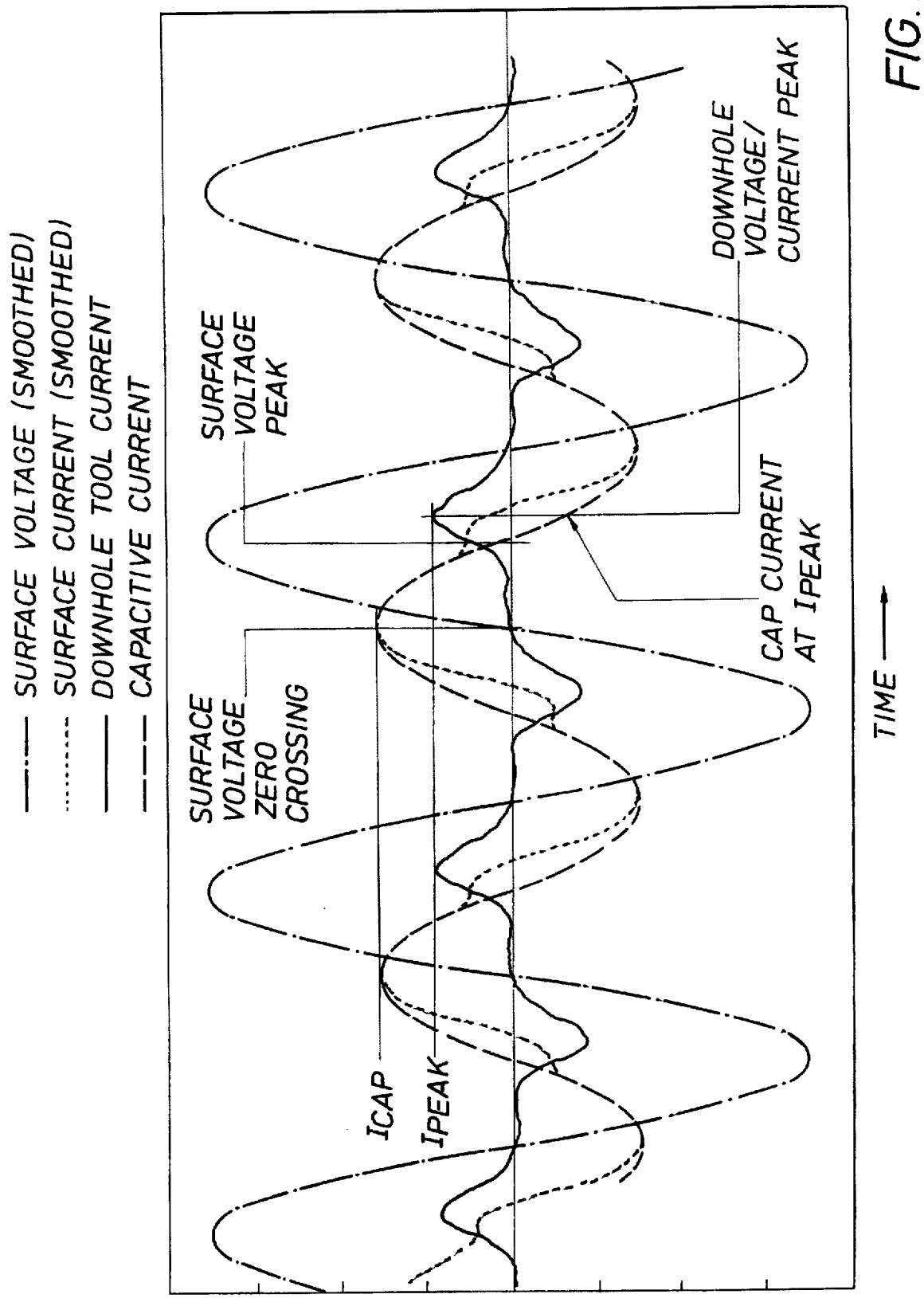
FIG. 16 is a graph of voltage and current waveforms, depicting the phase shift between the surface voltage waveform and downhole tool head voltage waveform.

As shown in FIG. 16, the reactive current flow over the resistive cable causes a phase shift between the surface voltage waveform and the downhole tool head voltage waveform. Because of this phase shift, some of the reactive current (as seen from the surface) is flowing at the same time as the peak resistive current (as seen at the tool head 28). This causes not only distortions in the downhole tool head voltage, but also affects the shape of the apparent downhole tool current waveform as calculated at surface. For this reason, an additional correction to the tool head voltage prediction is desirable to compensate for this residual reactive current flow.

The effects of the reactive current flow are handled by the introduction of an additional term into the model of Equation 4 (above). The equation calculates the downhole voltage relative to surface voltage. Because the respective model is based on relative calculations, and because the correction should also be relative to the percentage time of conduction, an additional term for capacitive current effect is introduced as the ratio of peak reactive current to peak resistive current, multiplied by the full wave half maximum figure.

Equation 6

$$\frac{V_d}{V_u} = \left( m_1 \cdot FWHM + m_2 \cdot FWHM^2 + m_3 \cdot FWHM \cdot \frac{I_{cap}}{I_{peak}} + y \right).$$

Figure 17:
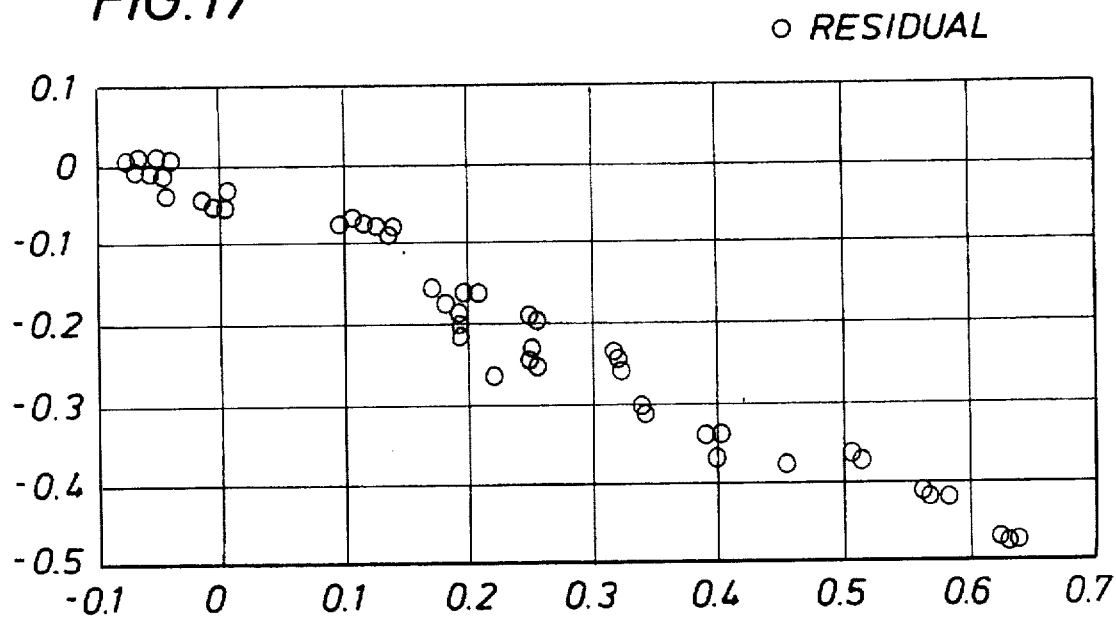
FIG. 17 is a graph showing the statistical significance of the ratio of peak reactive current to peak resistive current.

The capacitive current term above in Equation 6 has shown to be statistically significant in experiments (see FIG. 17), but does not directly measure effects of the phase shift. Two measurements which might prove useful for further refinement of the algorithm are the phase shift and the capacitive current correction at the time of the resistive current peak.

The physical distribution of the reactive load requires additional analysis. The interaction between the cable's evenly distributed capacitance and the toolstring's nonlinear inductance has several effects not immediately obvious from surface waveforms. When viewed from the surface, these two contributions tend to cancel each other, so that the apparent cable capacitance is less than actual (assuming the inductive effect smaller than the capacitive effect, as in the above figure). In addition, the tool power supply inductance drops considerably whenever the power supply draws current through its diodes. Because the $m_3$ term in Equation 6 is determined empirically, the effects of these additional reactive phenomena are included statistically by means of experimental data.

Surface Power Distortion Measurements

As shown in FIG. 11, the voltage prediction algorithm 68 preferably accounts for surface power distortion. Because in practice power supplies are subject to variation in frequency, the method should also be robust to changes in operating power supply frequency. This is accomplished by using the ratio of FWHM to power supply waveform cycle period, or PWHM (percentage width half maximum).

Equation 7

$$\frac{V_d}{V_u} = \left( m_1 \cdot PWHM + m_2 \cdot PWHM^2 + m_3 \cdot PWHM \cdot \frac{I_{cap}}{I_{peak}} + y \right).$$

The downhole tool head voltage prediction method of U.S. Pat. No. 5,483,232 illustrated a sinusoidal, zero impedance voltage source at surface. In practice, the voltage source at surface is subject to several types of distortions. The improved downhole head voltage method hereof is therefore modified to be more robust to distortions in the surface voltage waveform.

Figure 18:
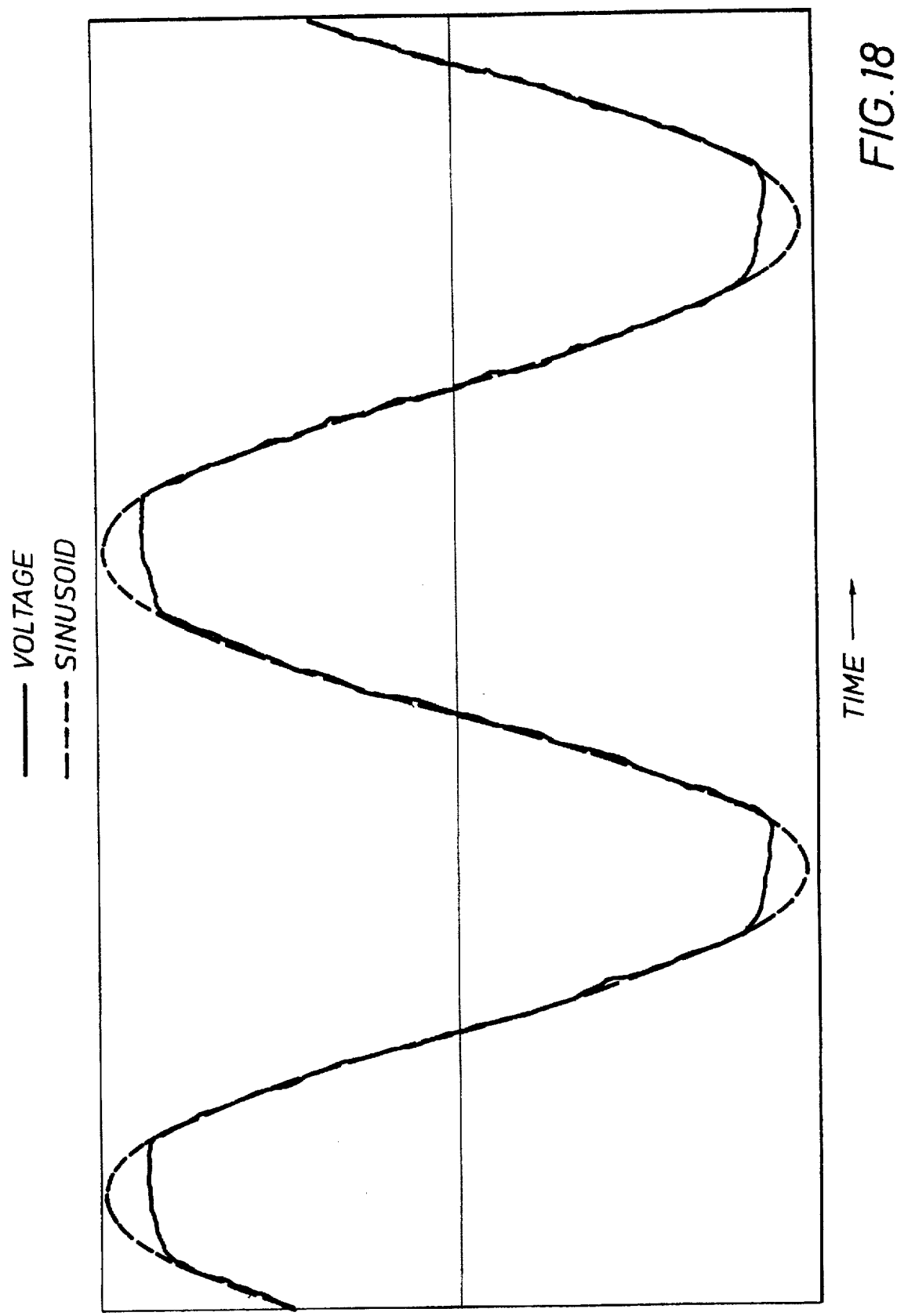
FIG. 18 is a plot of voltage supply waveforms illustrating the waveform "flat top" distortion to the peaks.

As previously suggested, very high frequency noise can be eliminated using a low pass filter. This has been successfully implemented using a moving average smoothing function. Unfortunately, a filter cannot be used to compensate for lower frequency distortions, since the measurements used by the algorithm rely on some of those lower frequency components. The most common type of lower frequency distortion in the voltage supply waveform is "peak-clipping", where the peak of the sinusoidal waveform has been clipped off, giving the peaks of the waveform a flat-top appearance (FIG. 18). Because this distortion is localized to the peaks of the waveform, any algorithm which uses the peak of the waveform as a representation of the total waveform will be highly sensitive to the distortion. The method of U.S. Pat. No. 5,483,232 is subject to this sensitivity.

In FIG. 18, the RMS voltage is 5.4% less than that of the overlying sinusoid, whereas the peak of the voltage is 11.6% less than the peak of the sinusoid. The RMS measurement is therefore more than twice as accurate as an estimate of the shape of the sides of the waveform and is preferably used in the method hereof.

Although the measure of interest for the method is the downhole peak voltage, the downhole peak voltage is not directly related to the surface peak voltage. As shown in FIG. 9, the downhole peak voltage is very closely related to the surface voltage at the time of the beginning of the downhole resistive current flow. But this current flow starts before (and ends after) the surface voltage waveform peak; the downhole voltage is therefore more sensitive to the surface voltage on either side of the peak before and after the peak-clipping.

In order to make the improved method hereof more robust to peak clipping, the method needs a measure of surface voltage which is robust to peak-clipping. An RMS measurement of the surface voltage is much more robust in this regard than the surface peak voltage; the surface RMS voltage has therefore replaced the surface peak voltage in the improved method (with appropriate changes in the coefficients of the equations).

In addition to the surface RMS voltage, the improved downhole head voltage prediction method uses the current waveform pulse width as a primary indicator of downhole voltage. The current pulse width is defined by the time of turn on and turn off of the current, which in turn depends on the timing of the voltage reaching a critical level. The improved method uses the pulse width to infer this critical voltage level by assuming a sinusoidal voltage waveform. In the case of a perfect sinusoid, the width leads directly to a voltage relationship via the Arccosine function (Equation 2). But if the pulse width of the surface voltage waveform is distorted, this relationship loses accuracy. Thus, changes in the surface voltage pulse width can have direct affects on the prediction method.

Of primary importance in this consideration is the relationship between the surface voltage magnitude reference and the surface voltage pulse width. If the peak voltage is used as a magnitude reference, then for equal peak voltages, the pulse width will differ dramatically between sinusoidal and peak-clipped waveforms. The use of an RMS surface voltage magnitude reference helps considerably to make the voltage magnitude to voltage pulse width relationship more reliable, but still leaves some margin of error. In order to further evaluate the surface voltage characteristics (in reference to downhole voltage prediction), the improved method measures surface voltage pulse width at the level of 0.7071 times measured RMS voltage (this corresponds to 50% peak for the sinusoidal case, but the measurement need not be made specifically at this level, and in fact may be more appropriate at a different level, depending on the characteristics of the system being studied). This measured width is expected to be one third of the voltage period, and any divergence from this expected value has a direct effect on current pulse width. This analysis then leads to the observation that the current pulse width should be corrected for voltage pulse width deviations prior to being used in the equation for downhole voltage prediction. The sensitivity of the current pulse width correction to voltage pulse width deviation is most accurately determined empirically, but should be close to one (a positive shift in voltage width implies a negative correction to current width of almost the same amount).

Although direct measurement of the surface voltage at the time current starts and stops flowing is not practical (due to noise), a voltage measurement which occurs near to that time might prove even more reliable than an RMS measurement as an indicator of surface voltage for use in the downhole voltage prediction method. The aforementioned advances in current and voltage waveform conditioning have made this measurement much more attractive.

Power Quality Assessment

One of the objects of the present invention is to permit the deployment of wireline logging units with various portable configurations. A portable wireline logging unit is required to utilize whatever source of power is available. If power into the logging unit is not of adequate quality, telemetry problems may result. These problems will be particularly difficult to troubleshoot in that they will masquerade as imaginary noise sources.

In order to simplify operation and troubleshooting of telemetry setups, the improved method hereof suggests that the power quality measurements used for compensation in downhole voltage prediction also be displayed as a diagnostic of the quality of power. Telemetry operation depends on the sum of this and all other sources of noise so this measure alone cannot predict when telemetry will fail. However; a quality measure below which (or a badness measure above which) telemetry is guaranteed to fall can be presented as well a danger zone where the probability of success is diminished due to high levels of interference caused by the AC power source.

This information will assist in troubleshooting telemetry problems. It can also help determine the level of performance that can be reasonably expected from adaptive telemetry systems where the amount of information transmitted depends on the quality of the channel (3, 4, 5 or 6 bits per symbol).

The following measures have been identified as significant indicators of surface power distortion. The first two measures are highly correlated, so that only one of them need be displayed; these two measures are excellent indicators of peak clipping, often an indication of the overloading of a power system. The third measure is most sensitive to high frequency noise, which is often caused by poorly isolated electronic equipment; this measure should also be displayed as this type of noise is likely to disrupt telemetry systems.

1. Comparison of RMS voltage to scaled peak voltage.
2. FWHM of the voltage waveform divided by the period (PWHM). For a pure sinusoidal waveform, the waveform will be beyond the 50% peak level for two-thirds of the cycle period. Peak clipping causes an increase in this figure. This indicator should be highly correlated to the previous indicator for most low frequency distortions (including peak-clipping).
3. Sum of squares residual after waveform smoothing. The sum of squares of the difference between the smoothed waveform and the raw waveform is a good indicator of the total energy of high frequency distortions. Wireline telemetry is especially sensitive to this type of high frequency distortion.

We claim:

1. A method for predicting the peak voltage at the load end of a transmission cable, the cable having a load end and a power supply end, comprising the steps of:

sampling the current and voltage of an AC waveform proximate the supply end of the cable to obtain a plurality of current and voltage samples representing respective current and voltage waveforms;

approximating a current pulse width function of said current waveform at the cable power supply end; and predicting an approximate remote end peak voltage by multiplying a supply end voltage by the current pulse width function.

2. The method of claim 1, said pulse width function including a full width at half maximum (FWHM) approximation of said current waveform.

3. The method of claim 2, said pulse width function comprising a ratio of said FWHM to power supply waveform cycle period (PWHM).

4. The method of claim 1, said pulse width function comprising $$(m \cdot FWHM + y)$$

where FWHM is a full width at half maximum approximation, m and y are constants.

5. The method of claim 1, said pulse width function comprising $$(m_1 \cdot FWHM + m_2 \cdot FHM^2 + y)$$

where FWHM is a full width at half maximum approximation, $m_1$, $m_2$, and y are constants.

6. A method for predicting the peak voltage at the load end of a transmission cable, the cable having a load end and a power supply end, comprising the steps of:

sampling the current and voltage of an AC waveform proximate the supply end of the cable to obtain a plurality of current and voltage supply samples representing respective current and voltage waveforms;

approximating a current pulse width function of said current waveform at the cable power supply end, predicting an approximate remote end peak voltage by multiplying a supply end voltage by the current pulse width function; and said pulse width function comprising $$\left( m_1 \cdot FWHM + m_2 \cdot FWHM^2 + m_3 \cdot FWHM \cdot \frac{I_{cap}}{I_{peak}} + y \right)$$

where FWHM is a full width at half maximum approximation, $m_1$, $m_2$, $m_3$, and y are constants, $$\frac{I_{cap}}{I_{peak}}$$

is the ratio of peak reactive current to peak resistive current.

7. The method of claim 6, where PWHM is substituted for FWHM and is the ratio of FWHM to power supply waveform cycle period.

8. The method of claim 1, where the current pulse width function includes the effects of capacitive current flow within the cable.

9. The method of claim 1, including the step of analyzing said current and voltage samples to diagnose power supply distortions.

10. The method of claim 1, wherein said supply end voltage of said predicting step is determined from said supply end voltage samples.

11. An apparatus for predicting the peak voltage at the load end of a transmission cable having a load end and a powersupply end comprising:

means for sampling the voltage proximate the power supply to obtain a plurality of voltage samples;

means for sampling the current proximate the power supply to obtain a plurality of current samples; and processor means connected to the current and voltage sampling means for determining a current pulse width function based on the current samples, determining a RMS supply end voltage value from the supply end voltage samples, predicting the peak load end voltage as a function of the RMS supply end voltage and current pulse width function.

12. The apparatus of claim 11, said current pulse width function comprising a full width at half maximum (FWHM) approximation of a current waveform represented by said power supply current samples.

13. The apparatus of claim 11, said current and voltage sampling means comprising an analog to digital converter for receiving analog current and voltage samples, for converting the analog samples to digital values, and for sending said digital values to said processor.

14. The apparatus of claim 11, said processor means being further operable for determining said current pulse width function including the effects of capacitive current flow on the cable.

15. A method of predicting the peak voltage at the downhole toolhead of a wireline logging cable having downhole and uphole ends, comprising the steps of:

sampling the current and voltage of an AC waveform transmitted over the logging cable proximate the supply end of the cable to obtain a plurality of uphole current and voltage samples;

determining a current pulse function of said uphole current waveform, said function including an adjustment for the effects of capacitive current on the wireline cable; and predicting an approximate downhole peak voltage at the downhole toolhead, including the product of said current pulse function and an uphole RMS voltage calculated from said uphole voltage samples.

16. The method of claim 15, including the step of predicting an approximate downhole peak current at the downhole toolhead.

17. The method of claim 9, wherein the step of analyzing said current and voltage samples to diagnose power supply distortions includes low pass filtering of the sampled waveforms.

18. The method of claim 9, wherein the supply end voltage of said predicting step is a supply RMS voltage chosen from said supply end voltage samples.

* * * * *